(12) United States Patent
Park et al.

(10) Patent No.: US 6,960,414 B2
(45) Date of Patent: Nov. 1, 2005

(54) MULTI-EXPOSURE LITHOGRAPHY METHOD AND SYSTEM PROVIDING INCREASED OVERLAY ACCURACY

(75) Inventors: Joon-soo Park, Gwacheon (KR); Chang-min Park, Seoul (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 247 days.

(21) Appl. No.: 10/305,681

(22) Filed: Nov. 27, 2002

(65) Prior Publication Data

US 2003/0186141 A1 Oct. 2, 2003

(30) Foreign Application Priority Data

Mar. 27, 2002 (KR) ........................................ 2002-16820

(51) Int. Cl.⁷ ................................................ G06F 9/00
(52) U.S. Cl. ............................................ 430/22; 430/30
(58) Field of Search ..................................... 430/22, 30

(56) References Cited

U.S. PATENT DOCUMENTS 5,989,761 A * 11/1999 Kawakubo et al. ........... 430/22
6,027,839 A    2/2000 Hashimoto ................... 430/22
6,331,369 B1 * 12/2001 Kawakubo et al. ........... 430/22
6,399,283 B1    6/2002 Hoshi ......................... 430/312

FOREIGN PATENT DOCUMENTS

JP    2000021749    1/2000    ......... H01L/21/027

OTHER PUBLICATIONS

Seong N. et al. "Pattern Displacement Error Under Off Axis Illumination" Japanese Journal of Applied Physics, Publication Office Japanese Journal of Applied Physics. Tokyo, JP. Part 37, No. 12B Dec. 1998, pp. 6695–6697.

* cited by examiner

*Primary Examiner*—Christopher G. Young
(74) *Attorney, Agent, or Firm*—F. Chau & Associates, LLC

(57) ABSTRACT

Multi-exposure lithography methods and systems that provide improved overlay accuracy. In one aspect of the invention, a method for multi-exposure lithography comprises determining overlay parameters corresponding to each of a plurality of sub-layouts, inputting the overlay parameters into an exposure system, exposing each sub-layout to photoresist on a wafer by using the exposure system, wherein prior to the exposure process for a given sub-layout, a correction process is performed for the sub-layout using a corresponding overlay parameter to correct an overlay of the sub-layout, and developing the exposed photoresist after exposing all of the sub-layouts.

18 Claims, 10 Drawing Sheets

MULTI-EXPOSURE LITHOGRAPHY METHOD AND SYSTEM PROVIDING INCREASED OVERLAY ACCURACY

CROSS-REFERENCE TO RELATED APPLICATION

This application claims priority to Korean Patent Application No. 02-16820 filed Mar. 27, 2002, which is incorporated herein by reference.

BACKGROUND OF THE INVENTION

1. Field of the Invention

The present invention, generally, relates to a lithography process for semiconductor fabrication. More particularly, the present invention relates to multi-exposure lithography methods and systems that provide improved overlay accuracy.

2. Description of Related Art

To perform a lithography process for manufacturing semiconductor devices having a stack structure, the overlay between a preformed lower layer and an upper layer must be checked. As semiconductor devices become highly integrated and reduced in size, the accuracy of the overlay between the lower layers and the upper layers becomes increasingly more important to improve the reliability and yield of the semiconductor devices.

Generally, the overlay is typically checked by using overlay marks as shown in FIG. 1. Referring to FIG. 1, an overlay mark 10 comprises a frame-shaped first mark 20, which is formed when a lower layer is formed in a previous process of a test wafer, and a plate-shaped second mark 30, which is formed in a subsequent process. In general, the overlay mark 10 is arranged in a scribe line that separates dies. However, when one field is formed of four dies, the overlay mark 10 is arranged at each corner of a field along the outermost scribe lines. In this case, the first mark 20 is formed by patterning the lower layer so that the first mark 20 is formed of the same material as the lower layer. The second mark 30 is formed when patterning a photoresist, i.e. the second mark 30 is formed of photoresist.

Measuring equipment is used to read X-axis direction gaps X1 and X2 between the first and second marks 20 and 30. Thereafter, an offset X of the second mark 30 is calculated using the measured X-axis direction gaps X1 and X2. Here, the offset X of the second mark 30 is a deviation value of the center of the second mark 30 from the center of the first mark 20. The offset X of the second mark 30 is calculated by subtracting the value X2 from the value X1 and dividing the subtraction value by 2. As the offset X approaches zero, the overlay becomes more accurate. Since the first and second marks 20 and 30 may shift in a Y-axis direction, an offset in the Y-axis direction may be measured after measuring the offset in the X-axis direction.

The measuring equipment provides various overlay parameters, including the offsets in the X-axis and Y-axis directions, to the exposure equipment. The overlay for subsequent wafers for forming actual semiconductor devices is corrected based on the measurement of the overlay parameters and an exposure process is performed.

FIG. 2 is a flowchart of the above-described exposure method. Referring to FIG. 2, photoresist is coated on a wafer (step 100), and a photomask and the wafer are aligned (step 110). Thereafter, an overlay is corrected using the measured overlay parameters that are input to the exposure equipment (step 120). Then, images are exposed (step 130), and the exposed photoresist is developed (step 140).

Improvements to the exposure equipment and lithography methods make it possible to manufacture devices of a small pitch having fine patterns. However, improvements to the exposure equipment typically do not match the demands of the semiconductor device manufacturers that desire to form finer patterns. As such, an illumination system can be used which is optimized for the patterns of specific shapes, e.g., an off-axis illumination or a small sigma conventional illumination. In other cases, photoresist, which is specialized for a contact hole, or line and space, may be used to meet to the demands of semiconductor device manufacturers.

Since semiconductor devices include various patterns on a single layer, existing exposure equipment and methods are not diverse enough to process the various patterns that may exist for highly integrated devices. Improving the exposure equipment is time consuming and costly with respect to the manufacture of the semiconductor devices. Therefore, it is advantageous to solve the above problems by focusing on the process, for example, using a multi-exposure lithography method.

In general, a multi-exposure lithography method is performed by separating the layout of one layer into two or more sub-layouts or sub-images according to shape, size, and pattern arrangement, and subsequently exposing the sub-layouts. Then, the multi-exposure method is completed by developing the layout on the layer. Each of the sub-layouts (or the sub-images) may be arranged on one photomask or a plurality of photomasks.

FIG. 3 illustrates various layouts that may be used for a multi-exposure lithography method. A layout 50 can be arranged on one photomask 40 and patterned by performing a single exposure process. However, to perform a multi-exposure method, the layout 50 can be divided into two sub-layouts 50a and 50b. The sub-layouts 50a and 50b can be arranged on one photomask 60 to perform the exposure process twice (i.e. once for each of the sub-layouts 50a and 50b). In another case, each of the sub-layouts 50a and 50b may be arranged on two separate photomasks 70a and 70b, respectively. When a multi-exposure lithography method is performed, the process latitude of exposure latitude (EL) and depth of focus (DOF) can be attained by using exposure conditions optimized for each sub-layout pattern.

Conventional multi-exposure lithography methods will now be described with reference to FIGS. 4 through 6. FIG. 4 is a flowchart of a conventional multi-exposure method, in which a plurality of sub-layouts or sub-images are arranged on one photomask. Referring to FIG. 4, a photoresist is coated on a wafer (step 200), and then the photomask and the wafer are aligned (step 210). Thereafter, an overlay is corrected using an input overlay parameter (step 220). Next, one sub-image is exposed according to the corrected overlay (step 230). Then, it is determined whether all sub-images are exposed (step 235). If another sub-image to be exposed exists, then the remaining unexposed sub-image is exposed using the same input overlay parameter (step 230). When all of the sub-images are exposed, the exposed resist is developed (step 240).

FIG. 5 is a flowchart of a conventional multi-exposure method, in which a plurality of sub-layouts or sub-images are arranged on a plurality of photomasks. Referring to FIG. 5, photoresist is coated on a wafer (step 300), and then a photomask and the wafer are aligned (step 310). Thereafter, an overlay is corrected using an input overlay parameter (step 320). Next, one sub-image is exposed according to the corrected overlay (step 330). Then, it is determined whether all sub-images are exposed (step 335). If a sub-image to be exposed exists, another photomask (having a next selected sub-image) and the wafer are aligned (step 310) and the overlay is corrected using the same input overlay parameter (step 320). The sub-image is exposed according to the corrected overlay (step 330). When all of the sub-images are exposed (affirmative determination in step 335), the exposed photoresist is developed (step 340). Although a correction process is performed after changing the photomasks in FIG. 5, the overlay parameter of the correction is not changed according to the characteristics of each sub-layout.

In the conventional methods, the input overlay parameter that is used when performing the overlay correction is preselected based on desired criteria. For instance, the overlay parameter of a sub-layout, whose overlay conditions should be managed most tightly, can be measured and fed back to the exposure equipment to be used as the overlay parameter. However, as the overlays of every pattern become important due to reduction of the design rule of the devices, the above-described method becomes inappropriate. In another case, the input overlay parameter can be determined by measuring overlay values between lower and upper layers for each sub-layout, and feeding back an average of the measured values to the exposure equipment to be used as the overlay parameter. This method represents calculating the average overlay offset of a plurality of the sub-layouts. However, as shown in FIG. 6, when each sub-layout has different registrations 85a and 85b for a field registration 80 of the lower layer, the correction according to the average value generates an uncorrectable residual term 85 for each sub-layout. Accordingly, the method of using the average value of the overlay offsets to determine an overlay parameter is inappropriate.

Regardless of the arrangement of a plurality of sub-layouts or sub-images on one photomask or on a plurality of photomasks, each image cannot have the same field registration. Consequently, methods for providing increased accuracy of the overlay according to the sub-layout in a multi-exposure lithography method and process would be highly desirable.

SUMMARY OF THE INVENTION

The invention is directed to multi-exposure lithography systems and methods that provide improved overlay accuracy when using a plurality of sub-images. In general, according to the present invention, methods and systems for performing multi-exposure lithography are optimized to independently correct the overlay according to the sub-layout or sub-image. The overlays are independently corrected according to overlay parameters corresponding to the sub-layout or sub-image so that the overlay accuracy is improved.

A multi-exposure lithography method according to one aspect of the invention comprises the following steps. Overlay parameters are determined for a plurality of sub-layouts that are to be exposed. The overlay parameters are then input into an exposure system. Subsequently, each of the plurality of sub-layouts is exposed to photoresist on a wafer using the exposure system. Prior to the exposure process for a given sub-layout, a correction process is performed for the sub-layout using a corresponding overlay parameter to correct an overlay of the sub-layout. Finally, after all the sub-layouts are exposed, the exposed photoresist is developed.

Preferably, a correction process comprises determining a parameter by the exposure system performing an alignment process, correcting the overlay parameter using the parameter determined by the exposure system to obtain an alignment parameter, and correcting the overlay for the sub-layout using the alignment parameter.

The overlay parameters may comprise X-axis and Y-axis offsets, X and Y scales for the wafer, X and Y magnifications for a field, or rotation and orthogonality between the wafer and the field, or any combination thereof.

The sub-layouts may be arranged on a single photomask or on a plurality of photomasks. When the sub-layouts are arranged on a single photomask, the wafer and the photomask, on which the sub-layout to be exposed is arranged, are aligned once by the exposure system prior to the exposure process. When the sub-layouts are arranged on a plurality of photomasks, the alignment of the wafer and the photomask, on which the sub-layout to be exposed is arranged, is performed before each correction process.

A multi-exposure lithography method according to another aspect of the present invention comprises the following steps. A plurality of frame-shaped first overlay marks are formed on the border of a die in patterning a first layer on a wafer. Then, a layout of a second layer is divided into a plurality of sub-layouts to pattern the second layer on the first layer by a multi-exposure method. Next, a photoresist is coated on the wafer, on which the first overlay marks are formed, to pattern the second layer. The sub-layouts are subsequently exposed to the photoresist, wherein second overlay marks are formed at locations aligned to each first overlay marks during each exposure process. Then, overlay parameters for the sub-layouts are determined by a measuring system. The overlay parameters include, inter alia, offsets between the first and second overlay marks. The overlay parameters are then input into an exposure system. Each sub-layout is subsequently exposed to the wafer, on which the first layer is patterned and the photoresist is coated, by using the exposure system. Prior to the exposure process for a given sub-layout, a correction process is performed for the sub-layout using a corresponding overlay parameter to correct an overlay of the sub-layout. The exposed photoresist is developed after exposing all of the sub-layouts.

Multi-exposure lithography methods according to the invention may be implemented as applications comprising instructions that are tangibly embodied on one or more program storage devices and executable by any machine or device comprising suitable architecture.

In another aspect of the present invention, a system for multi-exposure lithography comprises a plurality of program modules such as a program module for receiving a plurality of sub-layouts and corresponding overlay parameters, a program module for selecting a sub-layout to be exposed, and a program module for exposing each sub-layout to photoresist on a wafer, wherein prior to the exposure process for a selected sub-layout, a correction process is performed on the selected sub-layout using a corresponding overlay parameter to correct an overlay of the selected sub-layout, These and other embodiments, aspects, objects, features and advantages of the present invention will be described or become apparent from the following detailed description of the preferred embodiments, which is to be read in connection with the accompanying drawings.

DETAILED DESCRIPTION OF PREFERRED EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art.

Unlike the conventional methods discussed above, the methods and systems of the present invention optimize algorithms for the exposure system so that the exposure system independently corrects overlays according to each sub-layout or sub-image. Therefore, the present invention is suitable for a multi-exposure process.

Figure 1:
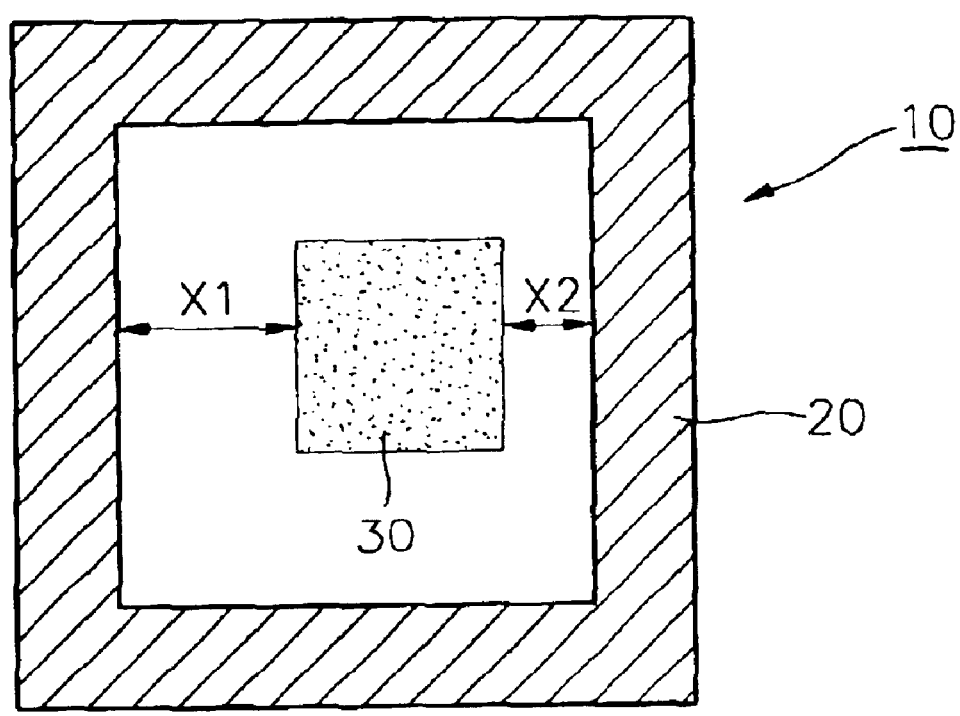
FIG. 1 shows an overlay mark for measuring overlay.
Figure 2:
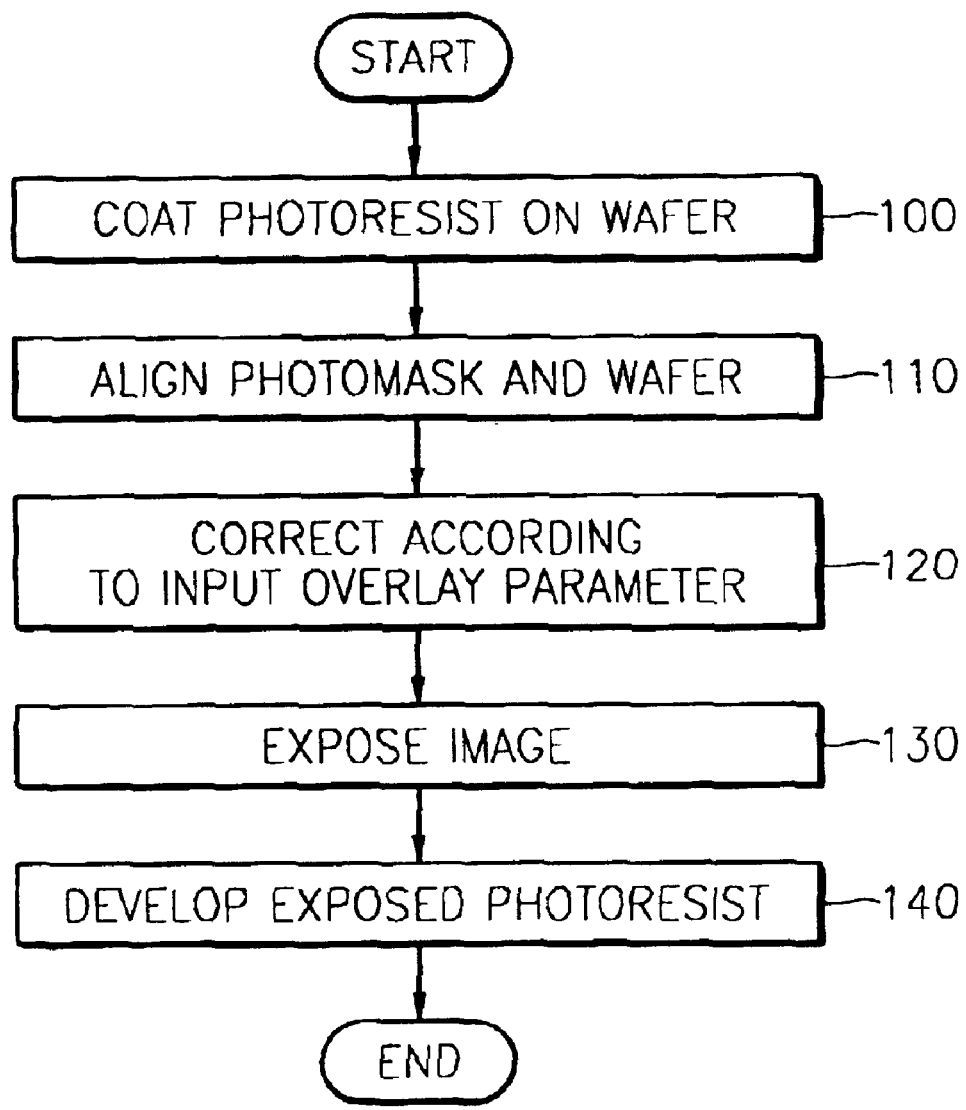
FIG. 2 is a flowchart of a conventional multi-exposure lithography method.
Figure 3:
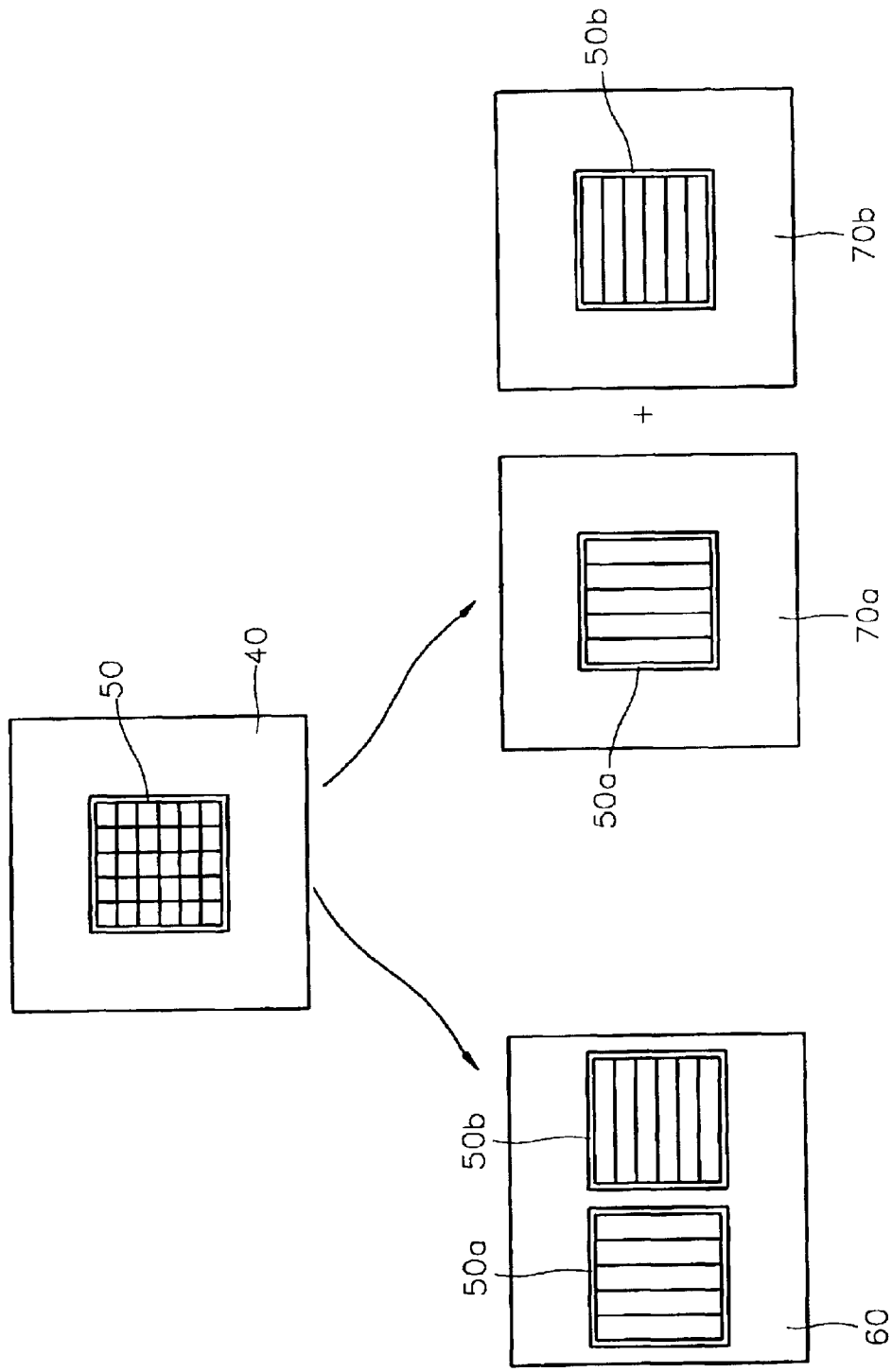
FIG. 3 shows various layouts that may be used for a multi-exposure lithography method.
Figure 4:
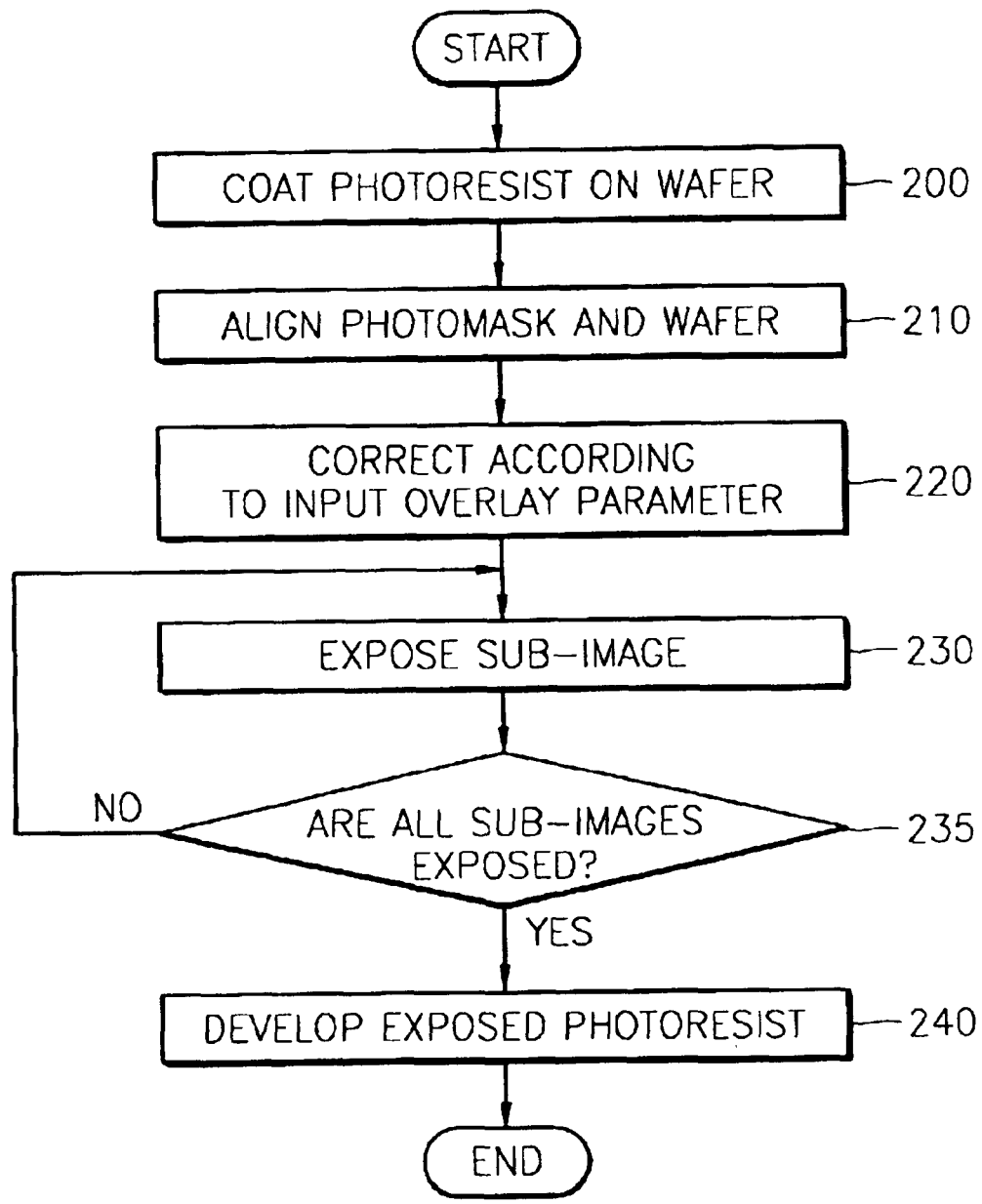
FIG. 4 is a flowchart of a conventional multi-exposure lithography method when a plurality of sub-layouts are arranged on one photomask.
Figure 5:
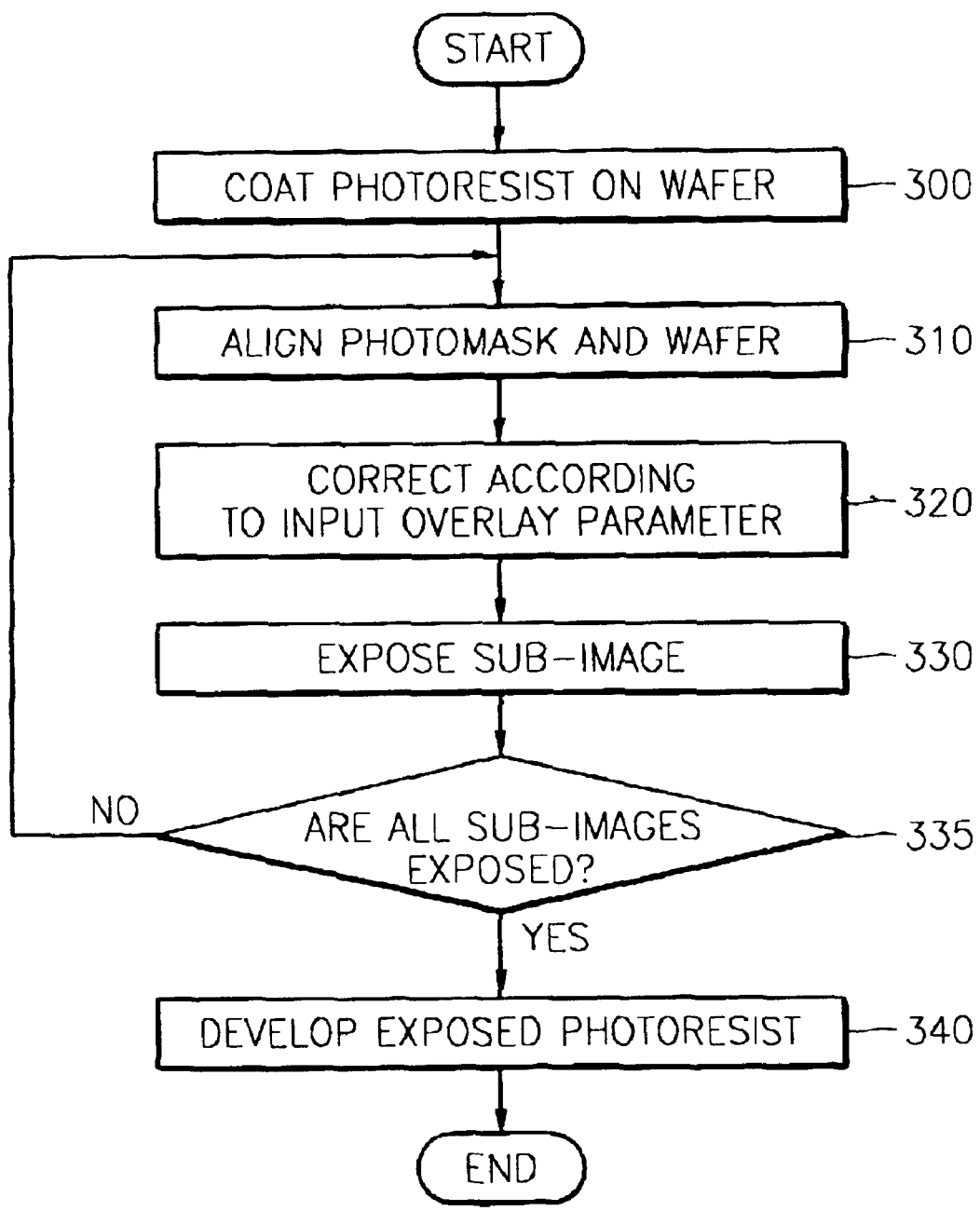
FIG. 5 is a flowchart of a conventional multi-exposure lithography method when a plurality of the sub-layouts are arranged on a plurality of photomasks.
Figure 6:
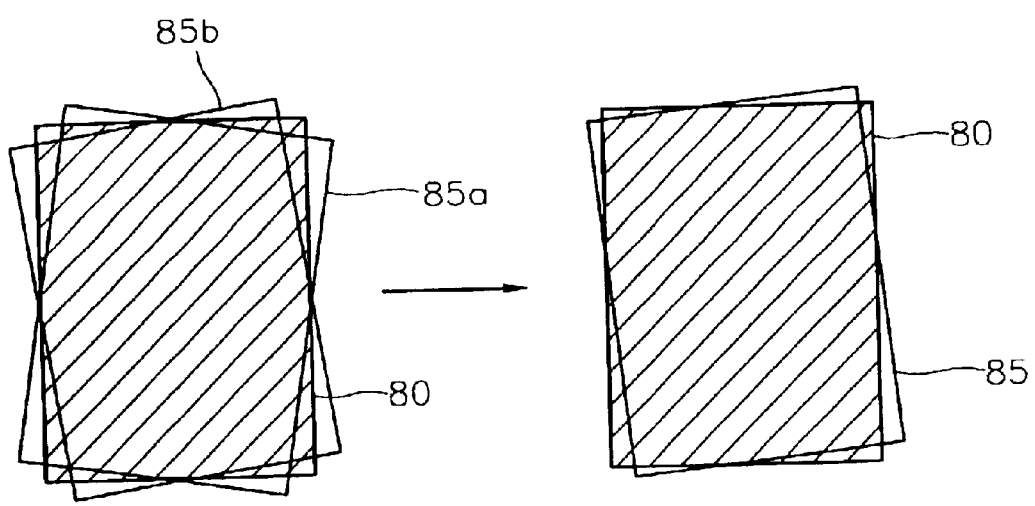
FIG. 6 is an exemplary diagram showing errors that are generated when applying the average of overlay offsets of several sub-layouts as a predetermined overlay parameter for a conventional multi-exposure lithography process.
Figure 7:
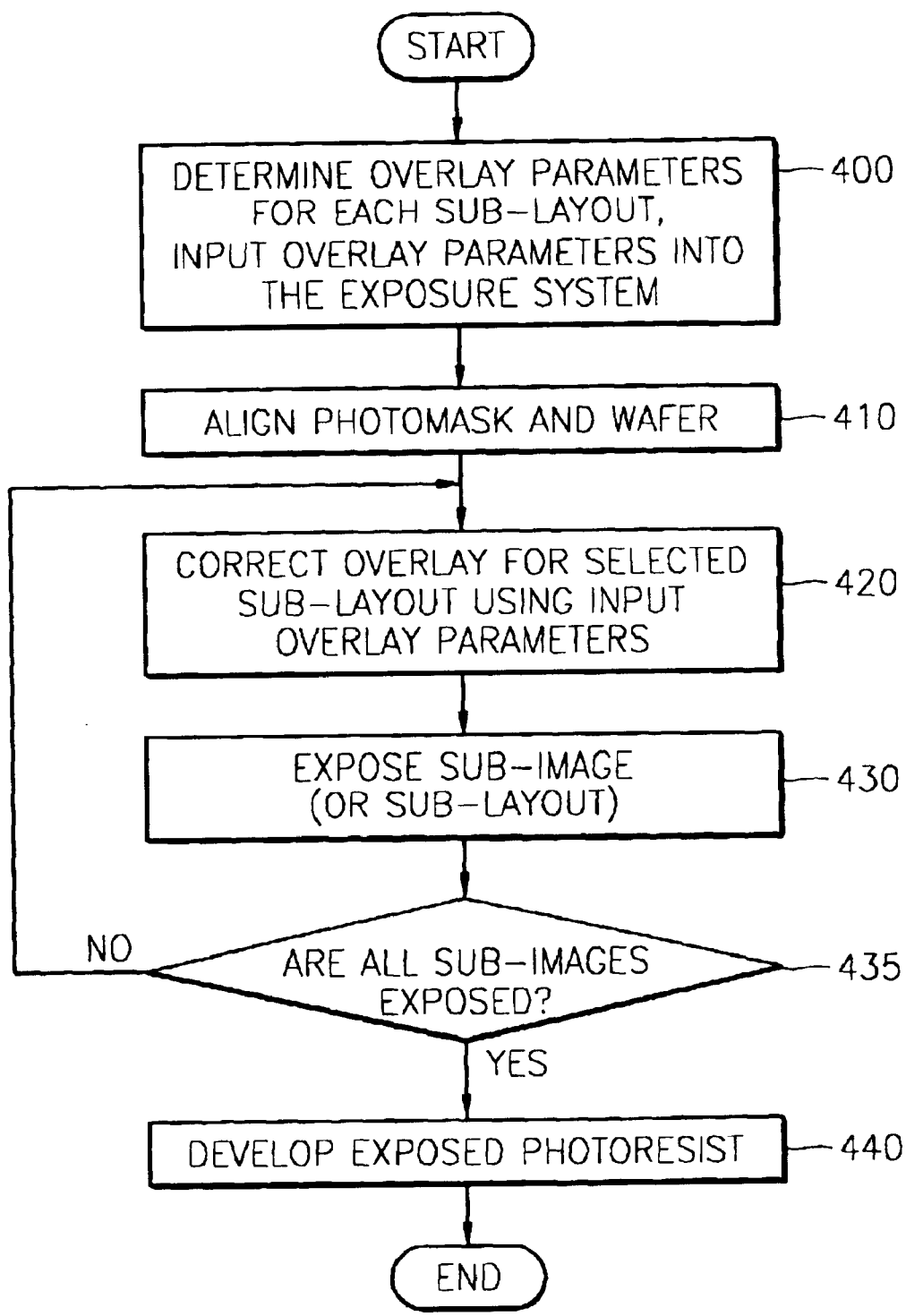
FIG. 7 is a flowchart of a multi-exposure lithography method according to an embodiment of the present invention.

FIG. 7 is a flowchart of a multi-exposure lithography process according to an embodiment of the present invention. More specifically, FIG. 7 illustrates a method for performing an overlay correction for each sub-image when two or more sub-layouts or sub-images are arranged on a single photomask.

Initially, one or more overlay parameters for each sub-layout are determined and input into an exposure system (step 400). The overlay parameters may include X-axis and Y-axis offsets, X and Y scales for a wafer, X and Y magnifications for a field, or rotation and orthogonality between the wafer and the field, or any combination thereof.

Then, the wafer, on which photoresist is coated, and the photomask are aligned (step 410). An overlay correction for a selected sub-layout to be exposed is performed using one or more corresponding input overlay parameters of the sub-layout (step 420). After correction, the sub-layout is exposed to the photoresist on the wafer using the exposure system (step 430). Then, it is determined whether all the sub-layouts to be exposed (step 435). If other sub-layouts to be exposed exist, steps 420 and 430 are repeated for all remaining sub-layouts. When all the sub-layouts are exposed (affirmative determination step 435), the exposed photoresist is developed (step 440). Since the overlay parameters are input into the exposure system (step 400), only the processes of steps 420 through 440 are performed for subsequent wafers.

Figure 8:
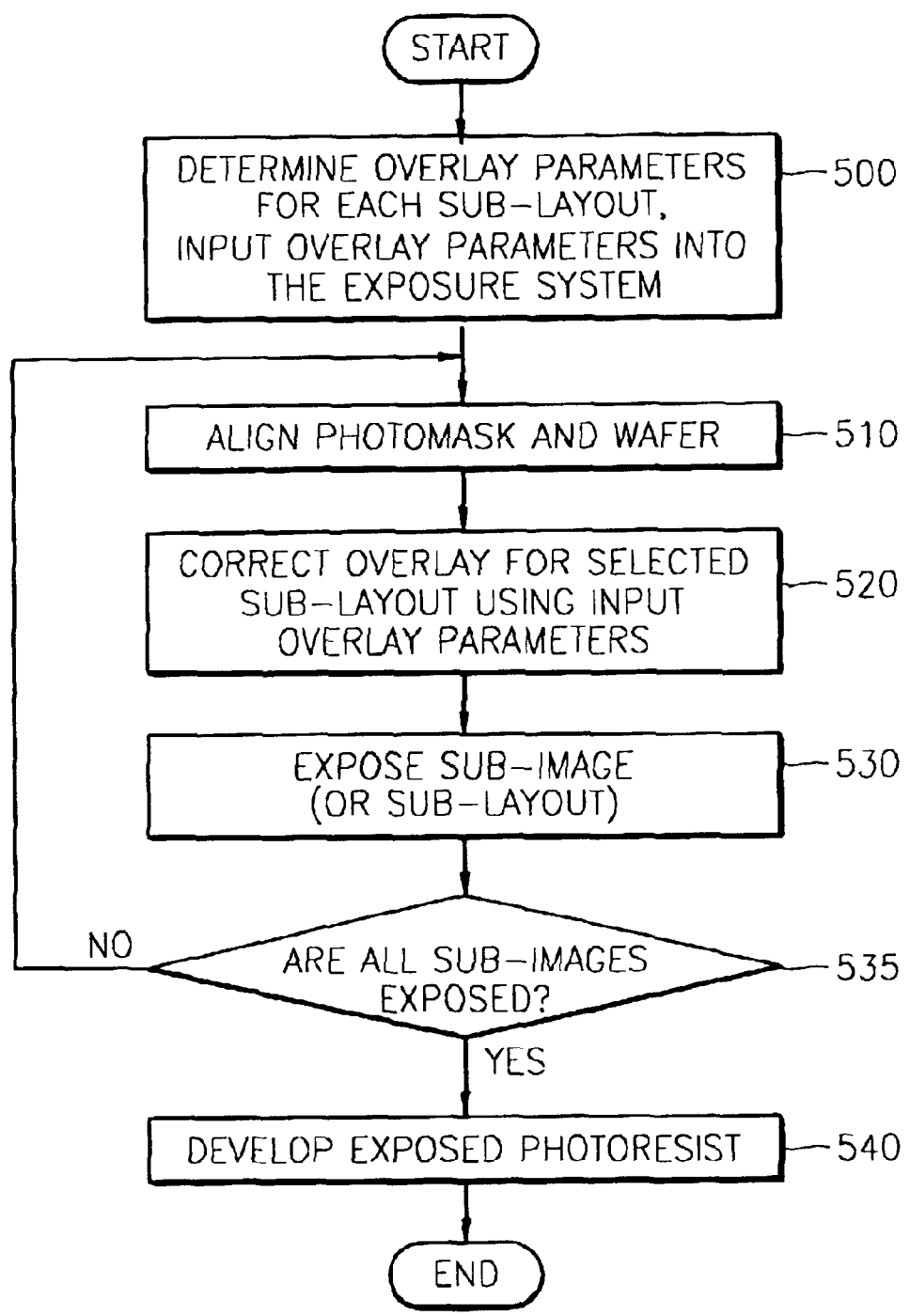
FIG. 8 is a flowchart of a multi-exposure lithography method according to another embodiment of the present invention.

FIG. 8 is a flowchart of a multi-exposure lithography process according to another embodiment of the present invention. More specifically, FIG. 8 illustrates a method for separately performing an overlay correction on each sub-layout or sub-image when two or more sub-layouts or sub-images are arranged on a plurality of photomasks.

Initially, one or more overlay parameters for each sub-layout are determined and input into an exposure system (step 500). The overlay parameters for a sub-layout may include X-axis and Y-axis offsets, X and Y scales for a wafer, X and Y magnifications for a field, or rotation and orthogonality between the wafer and the field, or any combination thereof.

Then, a sub-image is selected and the wafer (on which photoresist is coated) and the photomask (having the selected sub-image) are aligned (step 510). An overlay correction is performed for the selected sub-layout, using one or more corresponding overlay parameters of the selected sub-layout (step 520). After correction, the sub-layout is exposed to the photoresist on the wafer using the exposure system (step 530). Then, steps 510-530 are repeated for all remaining sub-images to exposed. When all the sub-layouts are exposed (affirmative determination in step 535), the exposed photoresist is developed (step 540). Since the overlay parameters are input into the exposure system (step 500), only the processes of steps 510 through 540 are performed for subsequent wafers.

Advantageously, according to embodiments of the present invention, since the correction of the overlay parameters takes place for each sub-image when arranging and exposing the sub-layouts or the sub-images on the lower layer, an overlay with improved accuracy can be obtained.

Figure 9:
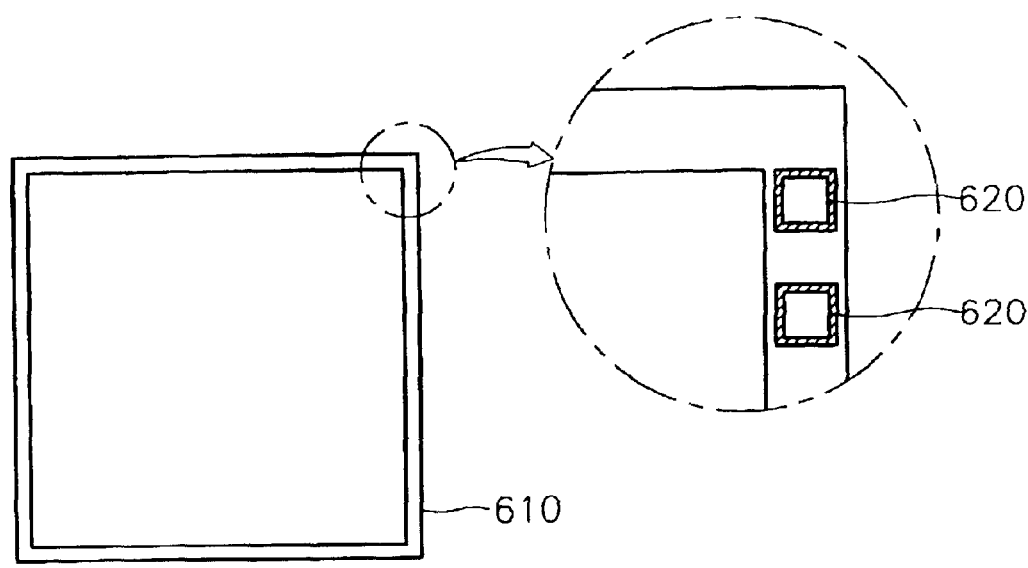
FIGS. 9 and 10 illustrate a method of correcting an overlay of a sub-layout, according an embodiment of the present invention.
Figure 10:
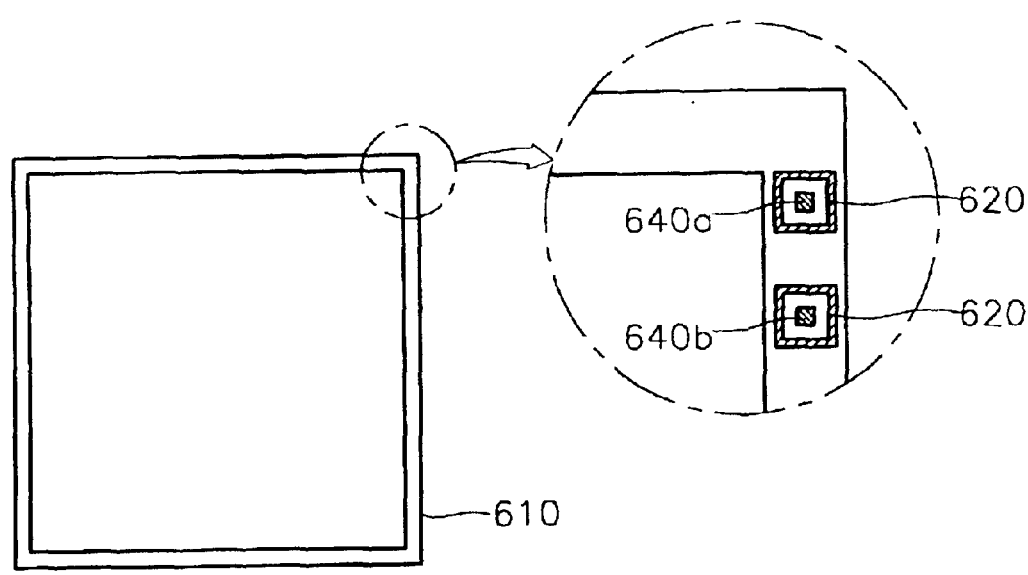
Figure 11:
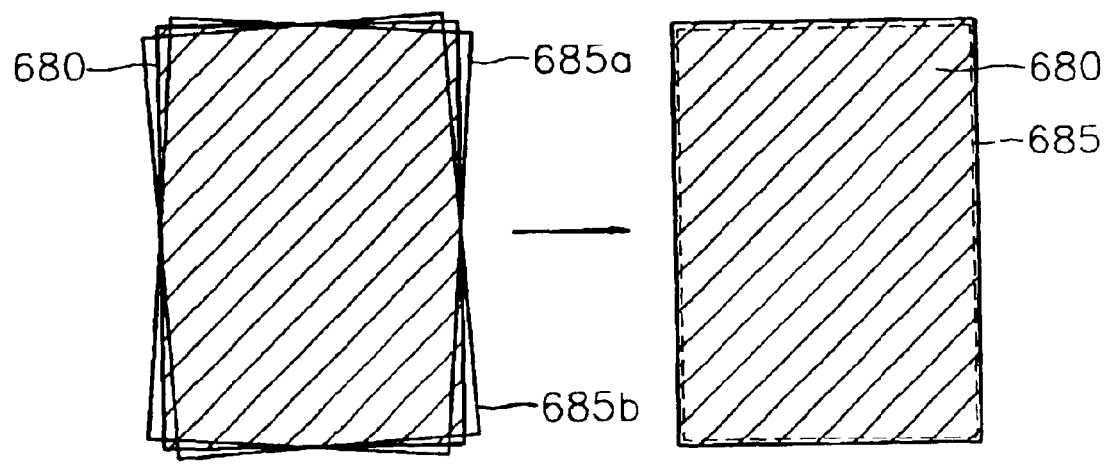
FIG. 11 is an exemplary diagram showing the effect of correcting the overlay of each sub-layout according to the present invention.

FIGS. 9 and 10 illustrate a method of correcting the overlay of sub-layouts according to an embodiment of the present invention. Referring to FIG. 9, a plurality of frame-shaped first overlay marks 620 are formed on the border of a die 610 in patterning a lower layer (not shown) on a wafer. To pattern an upper layer on the lower layer by a multi-exposure lithography method, the layout of the upper layer is divided into two or more sub-layouts. In an exemplary embodiment, the layout of the upper layer is divided into two sub-layouts. Next, referring to FIG. 10, photoresist (not shown) for patterning the upper layer is coated on the wafer having the frame-shaped first overlay marks 620. While subsequently exposing the sub-layouts to the photoresist, second overlay marks 640a and 640b are subsequently formed at locations aligned to the first overlay marks 620 during each exposure process. In other words, the second overlay mark 640a is formed when exposing the first sub-layout, and the second overlay mark 640b is formed when exposing the second sub-layout. The measuring system measures overlay parameters, including the offsets between the first overlay marks 620 and the second overlay marks 640a and 640b. Accordingly, the overlay parameters for each sub-layout are determined. The overlay parameters are input into the exposure system to perform overlay correction for each exposure process. Therefore, as shown in FIG. 11, even if a field registration 680 of the lower layer is different from field registrations 685a and 685b of the first and second sub-layouts on the upper layer, a field registration 685 of the upper layer accurately aligned to the field registration 680 of the lower layer is formed by performing the correction processes.

It is to be understood that the systems and methods described herein in accordance with the present invention may be implemented in various forms of hardware, software, firmware, special purpose processors, or a combination thereof. Preferably, the present invention is implemented in software as an application comprising program instructions that are tangibly embodied on one or more program storage devices (e.g., magnetic floppy disk, RAM, CD Rom, and ROM ), and executable by any device or machine comprising suitable architecture. For example, an application can be executed in a digital computer that operates the exposure system to perform a multi-exposure lithography method according to the invention.

In another embodiment, a system or application according to the invention comprises various program modules such as a program module for operating a measuring device that determines overlay parameters, a program module for receiving a plurality of sub-layouts and corresponding overlay parameters for each sub-layout for a multi-exposure process, a program module for selecting a sub-layout to be exposed, a program module for exposing a selected sub-image, wherein prior to the exposing process for a selected sub-layout, a correction process is performed on the selected sub-layout using its corresponding overlay parameters to correct the overlay on a wafer to which the sub-layout will be exposed, a program module for determining whether all sub-layouts have been exposed, and a program module for developing the exposed resist.

Based on the teachings herein, those of ordinary skilled in the art can readily design functional program codes and code segments that are actually coded in each of the program modules.

As described above, the methods and systems for multi-exposure lithography according to the invention are optimized to independently correct the overlay for each sub-layout or sub-image. As a result, the overlay accuracy is improved by independently correcting the overlays according to each sub-layout or sub-image.

As a result of the increased overlay accuracy, a rework process, which removes a photoresist pattern having errors in the overlay and repeats the exposure process, can be omitted. The elimination of the wafer rework processes provides advantages such as improved utilization and efficiency of the equipment, cost savings for rework equipment, and prevention of contamination on the wafer in the rework process. As a result, device yield is improved.

While this invention has been particularly shown and described with reference to preferred embodiments thereof, the preferred embodiments described above are merely illustrative and are not intended to limit the scope of the invention. It will be understood by those skilled in the art that various changes in form and details may be made therein without departing from the spirit and scope of the invention as defined by the appended claims.

What is claimed is:

1. A multi-exposure lithography method, comprising steps of:
   determining overlay parameters for a plurality of sub-layouts of a layout for one layer;
   inputting the overlay parameters into an exposure system;
   exposing photoresist through each sub-layout on a wafer by using the exposure system, wherein prior to the exposure process for a given sub-layout, a correction process is performed for the sub-layout using a corresponding overlay parameter to correct an overlay of the sub-layout; and
   developing the exposed photoresist after exposing the photoresist through all of the sub-layouts.

2. The method of claim 1, wherein the sub-layouts are arranged on one photomask.

3. The method of claim 2, wherein the exposing step comprises the step of aligning the wafer, on which the photoresist is coated, and the photomask.

4. The method of claim 1, wherein the sub-layouts are arranged on a plurality of photomasks.

5. The method of claim 4, wherein the exposing step further comprises the step of aligning the wafer, on which the photoresist is coated, and a photomask, on which the sub-layout to be exposed is arranged, before each correction process.

6. The method of claim 1, wherein the overlay parameters for a given sub-layout comprises X-axis and Y-axis offsets, X and Y scales for the wafer, X and Y magnifications for a field, or rotation and orthogonality between the wafer and the field, or any combination thereof.

7. The method of claim 1, wherein the correction process comprises:
   determining a parameter by the exposure system performing an alignment process;
   correcting the overlay parameter using the parameter determined by the exposure system to obtain an alignment parameter; and
   performing a correction of the overlay using the alignment parameter.

8. A multi-exposure lithography method, comprising the steps of:
   forming a plurality of frame-shaped first overlay marks on a border of a die in patterning a first layer on a wafer;
   dividing a layout of a second layer into two or more sub-layouts to pattern the second layer on the first layer by a multi-exposure lithography method;
   coating photoresist on the wafer, on which the first overlay marks are formed, to pattern the second layer;
   exposing the photoresist through the sub-layouts of the layout for the second layer, wherein second overlay marks are formed at locations aligned to each first overlay marks during each exposure process;
   determining overlay parameters for the sub-layouts of the layout for the second layer using a measuring system;
   inputting the overlay parameters into the exposure system;
   exposing the photoresist through each sub-layout to the wafer, on which the first layer is patterned, by using the exposure system, wherein prior to the exposure process for a given sub-layout, a correction process is performed for the sub-layout using a corresponding overlay parameter to correct an overlay of the sub-layout; and
   developing the exposed photoresist after exposing the photoresist through all of the sub-layouts.

9. The method of claim 8, wherein the sub-layouts are arranged on one photomask, and further comprising the step of aligning the photomask and the wafer.

10. The method of claim 8, wherein the sub-layouts are arranged on a plurality of photomasks, and further comprising the step of aligning the wafer and a photomask, on which the sub-layout to be exposed is arranged, before each correction process.

11. The method of claim 8, wherein the overlay parameters comprise X-axis and Y-axis offsets, X and Y scales for the wafer, X and Y magnifications for a field, or rotation and orthogonality between the wafer and the field, or any combination thereof.

12. The method of claim 8, wherein the correction process comprises:

determining a parameter by the exposure system performing an alignment process;

correcting the overlay parameter using the parameter determined by the exposure system to obtain an alignment parameter; and performing a correction of the overlay using the alignment parameter.

13. A program storage device readable by machine, tangibly embodying a program of instructions executable by the machine to perform the method steps of claim 8.

14. A program storage device readable by machine, tangibly embodying a program of instructions executable by the machine, to perform method steps for providing multi-exposure lithography, the method steps comprising:

determining overlay parameters for a plurality of sub-layouts of a layout for one layer;

inputting the overlay parameters into an exposure system;

exposing photoresist through each sub-layout on a wafer by using the exposure system, wherein prior to the exposure process for a given sub-layout, a correction process is performed for the sub-layout using a corresponding overlay parameter to correct an overlay of the sub-layout; and developing the exposed photoresist after exposing the photoresist through all of the sub-layouts.

15. The program storage device of claim 14, wherein the instructions for performing the exposing step comprise instructions for performing the step of aligning the wafer and the photomask once, when the sub-layouts are all arranged on one photomask.

16. The program storage device of claim 14, wherein the instructions for performing the exposing step comprise instructions for performing the step of aligning the wafer and a photomask before each correction process, when the sub-layouts are arranged on a plurality of photomasks.

17. The program storage device of claim 14, wherein the overlay parameters comprise X-axis and Y-axis offsets, X and Y scales for the wafer, X and Y magnifications for a field, or rotation and orthogonality between the wafer and the field, or any combination thereof.

18. The program storage device of claim 14, wherein the instructions for performing the correction process comprise instructions for performing the steps of:

determining a parameter by the exposure system performing an alignment process;

correcting the input overlay parameter using the parameter determined by the exposure system to obtain an alignment parameter; and performing a correction of the overlay using the alignment parameter.

\* \* \* \* \*